(12) United States Patent
Stimmell et al.

(10) Patent No.: US 6,296,906 B1
(45) Date of Patent: *Oct. 2, 2001

(54) ANNEALING PROCESS FOR LOW-K DIELECTRIC FILM

(75) Inventors: Jim Stimmell, San Jose; Joe Laia, Morgan Hill; Ajay Saproo, Mountain View, all of CA (US)

(73) Assignee: Novellus Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/410,171

(22) Filed: Sep. 30, 1999

(51) Int. Cl.$^7$ .............................. B05D 3/02; H01L 21/31
(52) U.S. Cl. ..................... 427/377; 427/385.5; 427/444; 438/781
(58) Field of Search ................................ 427/377, 385.5, 427/444; 438/781

(56) References Cited

U.S. PATENT DOCUMENTS

| | | | |
|---|---|---|---|
| 4,966,870 | * 10/1990 | Barber et al. | 437/228 |
| 5,139,971 | 8/1992 | Giridhar et al. | 437/195 |
| 5,538,758 | * 7/1996 | Beach et al. | 427/255.6 |
| 5,652,187 | * 7/1997 | Kim et al. | 437/240 |
| 5,886,867 | * 3/1999 | Chivukula et al. | 361/311 |
| 5,900,290 | 5/1999 | Yang et al. | 427/577 |

FOREIGN PATENT DOCUMENTS

25738 * 7/1997 (WO).

OTHER PUBLICATIONS

Neil H. Hendricks, *Organic polymers for IC intermetal dielectric applications*, Solid State Technology, Jul. 1995, pp. 3–5, 11, 117, 118, 120, and 122.

* cited by examiner

*Primary Examiner*—Brian K. Talbot
(74) *Attorney, Agent, or Firm*—Skjerven Morrill MacPherson LLP; David E. Steuber; Mark E. Schmidt

(57) ABSTRACT

Dielectric films in integrated circuits are annealed in the presence of water to improve their thermal stability and their resistance to damage from ultraviolet radiation.

10 Claims, No Drawings

ANNEALING PROCESS FOR LOW-K DIELECTRIC FILM

BACKGROUND OF THE INVENTION

1. Field of the Invention

The present invention relates to methods for thermally treating dielectric films in integrated circuits. More particularly, the present invention relates to methods of annealing dielectric films in the presence of water vapor to improve their thermal stability and to improve their resistance to damage from ultraviolet radiation and their recovery from damage caused by ultraviolet radiation.

2. Description of the Related Art

Capacitive coupling between metal lines in an integrated circuit increases in proportion to the dielectric constant of the intermetal layers, and increases in inverse proportion with the distance between metal lines. As the typical feature size in integrated circuits continues to decrease with each new generation of circuits, the spacing between metal lines in the circuits also decreases. Consequently, as integrated circuits increase in complexity and shrink in size, capacitive coupling between metal lines increases in magnitude. The signal delays associated with capacitive coupling similarly grow in magnitude, and degrade the performance of the circuits.

The capacitive coupling between metal lines may be decreased by reducing the dielectric constant of the intermetal layer. The intermetal layers are typically composed of $SiO_2$, which has a dielectric constant of approximately 4. Thus, industry is searching for materials with dielectric constant less than 4 which may be used in the intermetal layers of integrated circuits.

Several low dielectric constant materials have been investigated as substitutes for $SiO_2$ in integrated circuit intermetal layers. Examples of materials investigated as substitutes for $SiO_2$ include polyimides, polytetrafluoroethylene, parylenes, polysilsesquioxanes, fluorinated poly(aryl ethers), fluorinated amorphous carbon, organo silicate glasses available under the tradename CORAL™ from Novellus Systems Inc., and organo silicate glasses available under the tradename Black Diamond™ from Applied Materials Inc.

Intermetal layers composed of $SiO_2$ generally have favorable physical characteristics. For example, $SiO_2$ layers typically have good mechanical stability at elevated temperatures and good resistance to damage from ultraviolet radiation. These characteristics are advantageous, as the integrated circuit manufacturing process typically involves repeated exposure to ultraviolet radiation and to temperatures of at least 400° C. Exposure of the dielectric material to ultraviolet radiation may be intentional, or may be incidental to deposition, etching, or other processing of the wafer.

The performance of low dielectric constant material substitutes for $SiO_2$ in intermetal layers has not been entirely satisfactory. Particularly for organic dielectric films, deficiencies of these materials may include poor stability at elevated temperature, and high susceptibility to damage by exposure to ultraviolet radiation.

Dielectric intermetal layers may be annealed in an attempt to improve their performance. Since the presence of water in an intermetal layer may degrade the performance of an integrated circuit, in the prior art, annealing of the dielectric intermetal layers is typically done in the absence of water or with water present in the ambient environment at less than one part per million. Annealing low dielectric constant materials in a water free atmosphere generally fails to produce films that are entirely satisfactory substitutes for $SiO_2$ intermetal layers.

Accordingly, what is desired is a method for treating dielectric films to improve their thermal stability and to improve their resistance to damage from ultraviolet radiation.

SUMMARY OF THE INVENTION

In accordance with the present invention, methods for annealing dielectric films are presented whereby the thermal stability, resistance to damage from ultraviolet radiation, and recovery from damage from ultraviolet radiation of the dielectric films are improved. In the methods of the present invention, dielectric films are annealed in the presence of water vapor.

DETAILED DESCRIPTION

The present invention relates to methods for thermally treating dielectric films in integrated circuits. More particularly, the present invention relates to methods of annealing dielectric films in the presence of water vapor to improve their thermal stability, to improve their resistance to damage from ultraviolet radiation, and to improve their recovery from damage caused by ultraviolet radiation. The terms "anneal" and "annealing" are used herein to denote elevating the temperature of the dielectric film. The dielectric film may be immediately cooled after heating to the elevated temperature. Alternatively, the heated dielectric film may be maintained at the elevated temperature for a period of time.

The dielectric films treated by the methods of the present invention include but are not limited to films of parylene AF4, parylene C, parylene D, parylene N, other parylenes, polyimides, polytetrafluoroethylene, polysilsesquioxanes, fluorinated poly(aryl ethers), fluorinated amorphous carbon, organo silicate glasses available under the tradename CORAL™ from Novellus Systems Inc., and organo silicate glasses available under the tradename Black Diamond™ from Applied Materials Inc. Typically, the dielectric film is chosen to have a low dielectric constant. However, the methods of the present invention are not limited to low dielectric constant films. The films treated by the methods of the present invention may overlie substrates including but not limited to silicon wafers.

In the methods of the present invention, a dielectric film overlying a substrate is typically introduced into a vertical diffusion furnace. Other furnaces may be used in the methods of the present invention.

The atmosphere in the furnace typically includes, but is not limited to, nitrogen and oxygen. The total pressure in the furnace is typically about 760 torr. The atmosphere in the furnace includes water vapor. Typically, the water vapor is introduced into the atmosphere of the furnace by passing a mixture of nitrogen and oxygen gases through liquid water prior to introducing the gases into the furnace. Other means of introducing water vapor into the furnace may be used. The partial pressure of water in the gas mixture may correspond to saturation of the gas mixture with water vapor at ambient temperature. For example, at a typical ambient temperature of about 20° C., the partial pressure of water vapor in a water saturated gas mixture is about 17.5 torr. In other embodiments of the present invention the partial pressure of water in the gas mixture may range from about 2 torr to about 760 torr.

The temperature in the furnace is raised to an annealing temperature, which is typically between about 100° C. and about 500° C. The dielectric film and substrate may be maintained at the annealing temperature for an annealing period, which is typically between about 10 and about 120 minutes. Alternatively, the dielectric film may be immediately cooled after heating to the annealing temperature. The dielectric film and substrate may be annealed for one or more annealing periods. The annealing temperature may be different for each annealing period. The atmosphere in the furnace may be different for each annealing period.

For purposes of comparison, dielectric films of the same materials as used in the methods of the present invention were annealed in a water-free atmosphere. The annealing periods, temperatures, and atmospheres were otherwise identical with those of the present invention.

The annealed dielectric films produced by the methods of the present invention were evaluated for thermal stability and for resistance to damage from ultraviolet radiation. The annealed films were coated with a layer of $SiO_2$ or SiN impervious to gases. The $SiO_2$ or SiN coated films were exposed to between about 600 and about 4800 Joules of ultraviolet radiation, and then subjected to repeated cycling between about 250° C. and about 400° C. in a diffusion oven under a water-free nitrogen gas atmosphere.

A temperature cycle typically consisted of a waiting period at about 250° C., a ramp period during which the temperature of the $SiO_2$ or SiN coated film and substrate was raised from about 250° C. to about 400° C., a waiting period during which the temperature of the $SiO_2$ or SiN film and substrate was maintained at about 400° C., and a cooling period during which the temperature of the $SiO_2$ or SiN film and substrate cooled to about 250° C. Typically, the ramp period was of about 15 minutes duration, the waiting periods were of about 15 minutes to 60 minutes duration, and the cooling period was of about 30 minutes duration. The $SiO_2$ or SiN coated films were inspected between cycles.

The films annealed in a water-free atmosphere were evaluated for thermal stability and for resistance to damage from ultraviolet radiation by the same method as was used for the annealed dielectric films produced by the methods of the present invention.

After exposure to ultraviolet radiation and during repeated cycling between 250° C. and 400° C., the dielectric films produced by annealing under a water-free atmosphere typically failed within one hour by forming blisters in the $SiO_2$ or SiN coating. The blisters were apparently caused by gas produced by decomposition of the annealed dielectric film.

The annealed films produced by the methods of the present invention typically survived exposure to ultraviolet radiation and repeated cycling between 250° C. and 400° C. for five hours without blistering.

EXAMPLE

A dielectric film of parylene AF4 overlying a silicon wafer substrate was introduced into a vertical diffusion furnace. The gaseous ambient in the furnace was approximately 90% nitrogen and approximately 10% oxygen. This gaseous ambient was saturated with water vapor at an ambient temperature of about 20° C. by passing it through water before introducing it into the furnace. The total gas pressure in the furnace was about 760 torr. The partial pressure of water vapor in the furnace was about 17.5 torr. The temperature in the furnace was raised to approximately 400° C. and held at that temperature for approximately 60 minutes. The dielectric film overlying a silicon substrate was removed from the furnace.

The dielectric film of parylene AF4, annealed for approximately 60 minutes at approximately 400° C. in nitrogen and oxygen with a partial pressure of water of about 17.5 torr, was tested for resistance to damage from exposure to ultraviolet radiation and for thermal stability. The annealed film was coated with a layer of $SiO_2$ impervious to gases. The $SiO_2$ coated film was exposed to about 2700 Joules of ultraviolet radiation, and then subjected to repeated cycling between about 250° C. and about 400° C. in a diffusion oven under a water-free nitrogen gas atmosphere.

A temperature cycle consisted of a waiting period at about 250° C., a ramp period during which the temperature of the $SiO_2$ coated film and substrate was raised from about 250° C. to about 400° C., a waiting period during which the temperature of the $SiO_2$ coated film and substrate was maintained at about 400° C., and a cooling period during which the temperature of the $SiO_2$ coated film and substrate cooled to about 250° C. The ramp period was of about 15 minutes duration, the waiting periods were of about 30 minutes duration, and the cooling period was of about 30 minutes duration. The $SiO_2$ coated film was inspected between cycles. The annealed film survived exposure to ultraviolet radiation and 5 hours of thermal cycling between 250° C. and 400° C. without blistering.

The embodiments of this invention described above are illustrative and not limiting. Many additional embodiments will be apparent to persons skilled in the art from the descriptions herein.

We claim:

1. A method of annealing a low dielectric constant film in an integrated circuit comprising:

placing the low dielectric constant film overlying a substrate in a furnace, said film having a dielectric constant less than about 4;

introducing a gas mixture into said furnace, the gas mixture including water vapor at a concentration greater than about three parts per thousand; and annealing said low dielectric constant film in said furnace at an annealing temperature less than about 500° C. for an annealing period.

2. The method of claim 1 wherein said gas mixture is saturated with water vapor at ambient temperature when said gas mixture is introduced into said furnace.

3. The method of claim 1 wherein said gas mixture comprises water at partial pressure from about 2 torr to about 760 torr.

4. The method of claim 1 wherein said gas mixture comprises nitrogen and oxygen.

5. The method of claim 1 wherein said annealing temperature lies in the range between about 100° C. and about 500° C.

6. The method of claim 1 wherein said annealing period lies in the range between about 10 minutes and about 120 minutes.

7. The method of claim 1 wherein said dielectric film is an intermetal layer in an integrated circuit.

8. The method of claim 1 wherein said low dielectric constant film is of a material selected from the group consisting of parylene AF4, parylene C, parylene D, parylene N, other parylenes, polyimides, polytetrafluoroethylene, polysilsesquioxanes, fluorinated poly(aryl ethers), fluorinated amorphous carbon, and organo silicate glasses.

9. The method of claim 8 wherein said low dielectric constant film is a film of parylene AF4.

10. The method of claim 1 wherein said substrate is a silicon wafer.

* * * * *